(12) United States Patent
Cheng et al.

(10) Patent No.: US 8,319,524 B1
(45) Date of Patent: Nov. 27, 2012

(54) DEGLITCH CIRCUIT REMOVING GLITCHES FROM INPUT CLOCK SIGNAL

(75) Inventors: Chi Fung Cheng, San Jose, CA (US); Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 2627 days.

(21) Appl. No.: 10/752,785

(22) Filed: Jan. 5, 2004

(51) Int. Cl.
*G01R 29/02* (2006.01)

(52) U.S. Cl. .......................................... 327/34
(58) Field of Classification Search .................. 327/34
See application file for complete search history.

(56) References Cited

U.S. PATENT DOCUMENTS

| | | | | |
|---|---|---|---|---|
| 4,216,388 A | * | 8/1980 | Wilson | 327/34 |
| 4,471,235 A | * | 9/1984 | Sakhuja et al. | 327/34 |
| 4,596,939 A | * | 6/1986 | Yamada | 327/206 |
| 5,151,612 A | * | 9/1992 | Ishikawa | 327/34 |
| 5,815,030 A | * | 9/1998 | Wuidart et al. | 327/551 |
| 5,815,690 A | | 9/1998 | Kowert et al. | |
| 6,075,473 A | | 6/2000 | Masuda | |
| 6,304,199 B1 | | 10/2001 | Fang et al. | |
| 6,507,221 B2 | * | 1/2003 | La Rosa | 327/34 |
| 6,535,024 B1 | * | 3/2003 | Rochard | 327/34 |
| 6,680,637 B2 | * | 1/2004 | Seo | 327/175 |
| 7,187,213 B2 | * | 3/2007 | Yoshida et al. | 327/34 |

* cited by examiner

*Primary Examiner* — Kenneth B. Wells

(57) ABSTRACT

An apparatus, method, and system for removing glitches from a clock signal, including a duty cycle lock loop (DCLL) circuit. A glitch, which may produce errors in the clock signal, may occur when a read channel transitions from an acquired clock signal to an adjusted clock signal. In one embodiment of the inventive deglitch circuit, a first capacitor is charged and discharged in response to an input clock signal, and an output clock signal is provided depending upon the first capacitor's voltage. The output clock signal further charges and discharges a second capacitor whose ratio of charge to discharge currents provides a signal to bias the discharge current of the first capacitor. A second DCLL circuit may be provided to restore the output clock signal duty cycle to the original clock signal duty cycle.

3 Claims, 7 Drawing Sheets

DEGLITCH CIRCUIT REMOVING GLITCHES FROM INPUT CLOCK SIGNAL

BACKGROUND OF THE INVENTION

1. Field of the Invention

This invention relates in general to the field of information storage, and more particularly to the acquisition of timing signals in a read channel.

2. Description of the Related Art

Many systems using digital data need to convert an analog signal to digital data for further use. Converting analog data to digital data may require a clock synchronized with the analog data.

Often, in data communication or transmission systems, data is formatted with timing information which may be retrieved in order to establish a clock that has the same frequency and phase offset as the data. The schematic block diagram shown in FIG. 1 is one way in which the clock may be synchronized with the data. ADC 101 receives a signal from the transducing head and a clock signal from interpolator 103 for converting the analog signal from the transducing head to a digital signal. The ADC 101 provides a signal to the timing loop control 102, which in turn provides an adjusted clock to the interpolator 103.

FIG. 2 shows one schematic representation of the interpolator 103. The adjusted clock, CLK A, provides an input to a phase delay circuit 201 wherein a second clock, CLK B, is generated having the same frequency as CLK A but with a fixed phase delay or offset of between 0 and $\pi/2$. Each CLK A and CLK B also provide inputs to a selection circuit 202, which determines when to switch from CLK A to CLK B and directs a multiplexer 203 to provide either CLK A or CLK B as the reference clock.

FIG. 3 shows the relation between CLK A and CLK B wherein the phase offset is depicted as $\pi/2$, although the phase offset may be any value between 0 and $\pi/2$. When the selection circuit switches from CLK A to CLK B, a "glitch," which is an unwanted pulse of a short duration that interferes with the operation of process circuitry such as the ADC, may occur. The switching between CLK A and CLK B may occur at any time during either clock cycle. As a result, sometimes a glitch may occur, but sometimes not.

Looking at this phenomenon in a little more detail, the interpolator 103 provides a reference clock based upon either CLK A or CLK B. The reference clock is high when the clock from which it is based is high. For example, if the transition occurs when CLK A is low and CLK B is high, the reference clock also goes high for the remainder of the CLK B cycle, thereby generating a glitch. Likewise, if the transition occurs when CLK A is high and CLK B is low, the reference clock also goes high for the remainder of the CLK A cycle, and once again, a glitch will result. If the transition occurs when CLK A and CLK B are both either high or low, no glitch is produced. A desired reference clock signal having a transition from CLK A to CLK B does not have pulses of short duration (glitches), but instead lengthens the cycle in which the transition occurs.

Therefore, a need exists for a circuit to remove glitches from a clock signal, to improve the operational reliability of subsequent circuits which depend on a stable clock signal.

SUMMARY OF THE INVENTION

To address the stated need and fulfill other desired objectives, in accordance with one embodiment of the invention, a deglitch circuit provides a digital signal free of short unwanted pulses that may interfere with the timing of dependent circuits. In one embodiment, the deglitch circuit comprises a duty cycle lock loop (DCLL) circuit to remove glitches. If necessary, a second DCLL circuit may be provided to restore the input clock duty cycle, though this is not always necessary, particularly where the duty cycle resulting from the first DCLL is acceptable. The DCLL in the inventive deglitch circuit charges a first capacitor at a different rate than discharging the first capacitor in response to an input clock pulse, thereby creating a waveform having an amplitude proportional to the duration of the input clock pulse. An output clock pulse is generated when the amplitude of the waveform exceeds a predetermined threshold, and no pulse is generated when the amplitude fails to exceed the threshold. The output clock pulse may be of a different period than the input clock pulse. The rate of discharge of the first capacitor depends upon the ratio of a second capacitor charge and discharge currents.

DETAILED DESCRIPTION OF EMBODIMENTS

Figure 4:
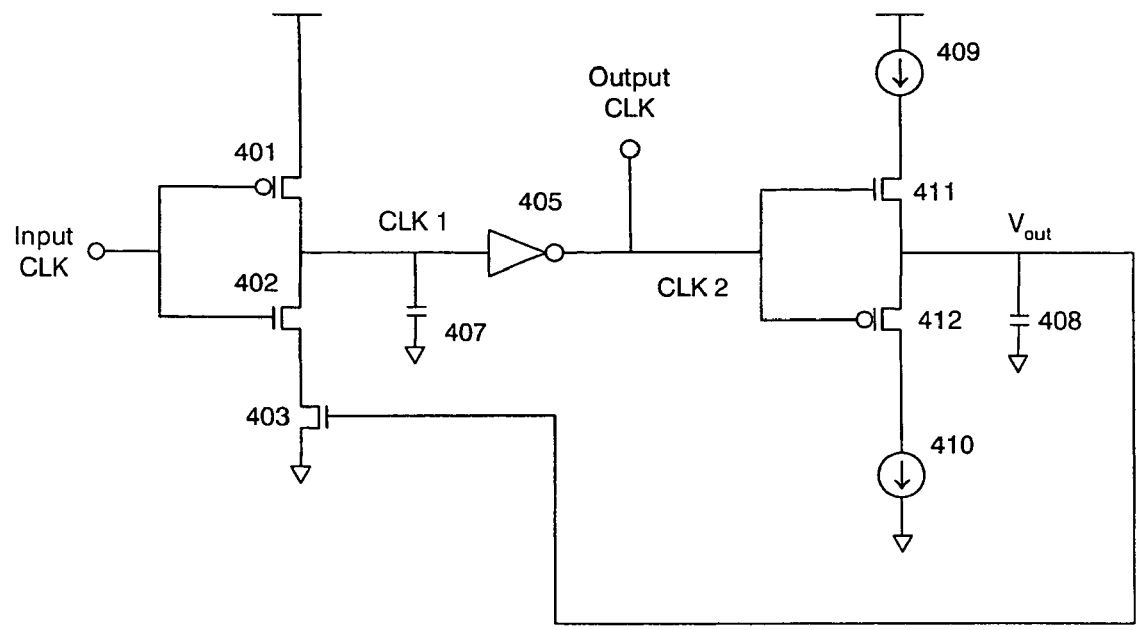
FIG. 4 is one embodiment of the inventive deglitch circuitry.
Figure 5:
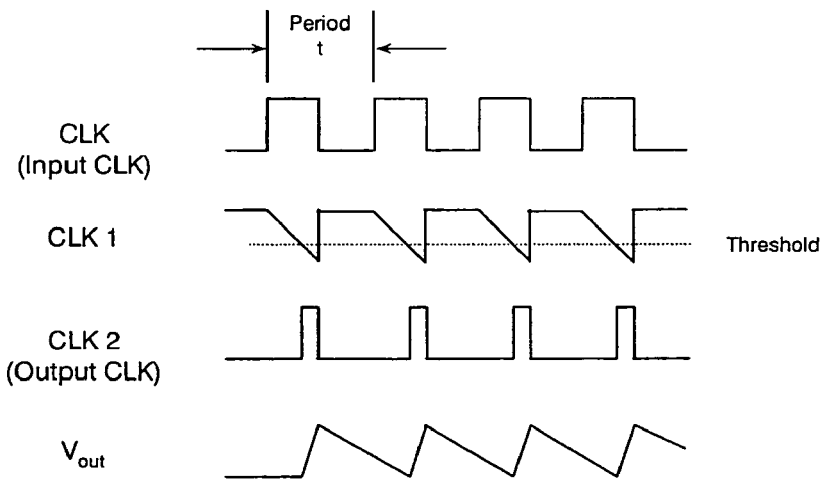
FIG. 5 shows the relationship of an input clock signal, without a glitch, to various signals of the inventive circuitry.

Referring now to FIGS. 4 and 5, the input signal CLK, shown in FIG. 5, has a period of t and a 50-50 duty cycle in which CLK is high for half the cycle, and low for the other half of the cycle. Transistor 401 switches on and transistor 402 switches off when CLK is low. When transistor 401 switches on (CLK is low), capacitor 407 charges rapidly because the amount of current supplied by transistor 401 is not limited. When transistor 401 switches off and transistor 402 switches on (CLK is high), capacitor 407 discharges at a rate controlled by transistor 403, which is biased by the feedback of the DCLL. The resultant signal CLK1, shown in FIG. 5, is inverse to the input signal CLK.

CLK1 is the input to inverter 405, which produces a signal CLK2. Inverter 405 changes state when CLK1 falls below a predetermined threshold, and CLK2 has a duty cycle that is determined by the charging and discharging rates of capacitor 407. CLK2 controls the charging and discharging currents to capacitor 408, thereby producing the voltage $V_{out}$ that is used to bias transistor 403 for controlling the discharge rate of capacitor 407.

CLK2 controls the charging time of capacitor 408 by controlling transistors 411 and 412. Transistor 411 switches on when CLK2 is high, thereby allowing current source 409 to charge capacitor 410. When CLK2 is low, transistor 411 switches off and transistor 412 switches on, allowing capacitor 408 to discharge at a rate determined by current source 410. Each current source 409, 410 may be adjusted to provide a controllable charging or discharging current. The ratio of charging current to discharging current determines the duty cycle of CLK2. For example, a charging current of 4i and a discharging current of i will produce a 20-80 duty cycle in which CLK2 is high for ⅕ of a cycle and low for ⅘ of a cycle. This duty cycle is controllable depending upon the ratio of charging to discharging currents of capacitor 408.

Figure 6:
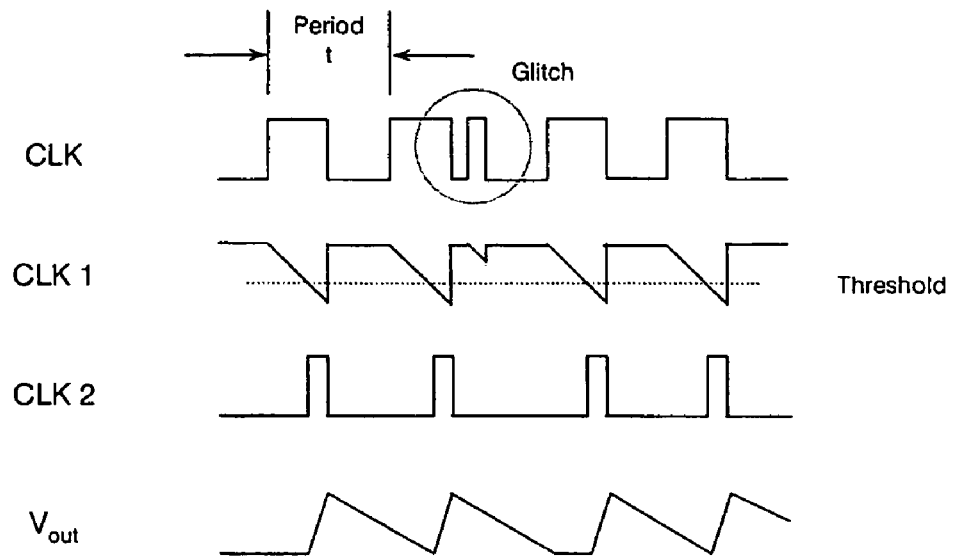
FIG. 6 shows the relationship of an input clock signal, with a glitch, to various signals of the inventive circuitry.

Referring now to FIGS. 4 and 6, a signal having a glitch is applied to the duty cycle lock loop circuit. FIG. 6 shows the clock signal having a glitch in relation to the CLK1, CLK2, and $V_{out}$ signals. When CLK is high, capacitor 407 discharges at a rate set by the bias transistor 403. During the period of the glitch, capacitor 407 does not have the time to discharge sufficiently to reach the threshold at which inverter 405 changes state. Therefore, the inverter 405 does not produce a pulse corresponding to the glitch pulse, and thus CLK2 is "glitch free".

Figure 1:
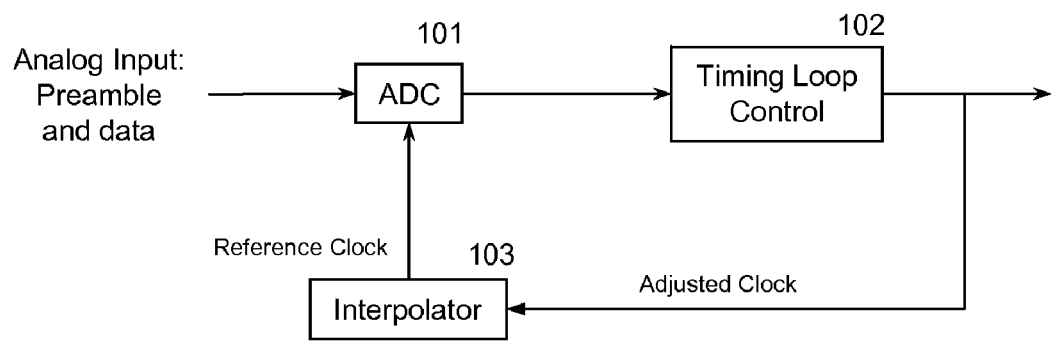
FIG. 1 is a schematic block diagram showing a typical circuit for correcting phase offset of a clock signal.
Figure 2:
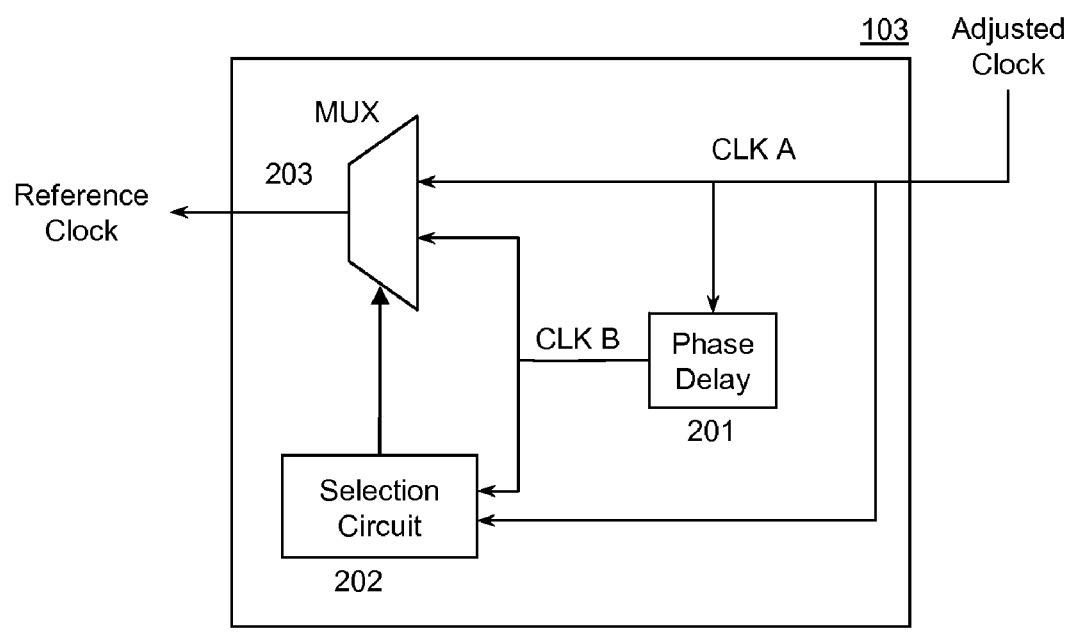
FIG. 2 is a schematic representation of an interpolator used in the circuit of FIG. 1.
Figure 3:
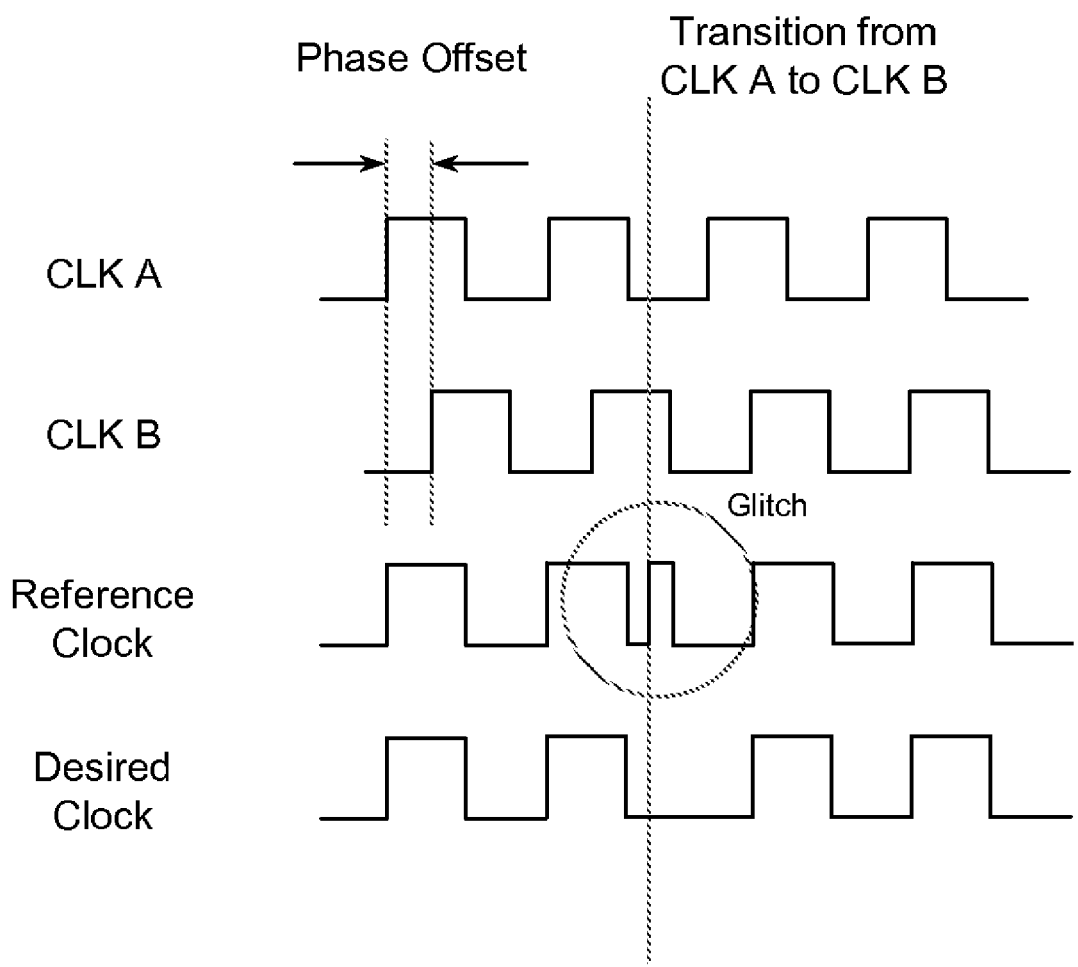
FIG. 3 is a timing diagram showing the relation between a clock signal and a clock signal with a phase offset, wherein a glitch may be produced depending on when a switch is made from one clock to another clock.

Because the interpolator 203 is configured to provide a reference clock that has a maximum offset of $\pi/2$ to the adjusted clock, the maximum duration of a glitch is t/4. Referring to FIG. 3, the reference clock synchronizes with CLK A before the transition to CLK B, and synchronizes with CLK B after the transition. The point at which the reference clock transitions from CLK A to CLK B is a fixed delay, independent of the frequency, with respect the decision to effect the transition. But because the clock period is varying, the transition may occur at a varying percentage of the clock period thereby causing a glitch. Knowing the maximum duration of a glitch is t/4, the ratio of capacitor 408 charging and discharging currents may be selected to ensure that inverter 405 does not change state, thereby eliminating the glitch.

Figure 7:
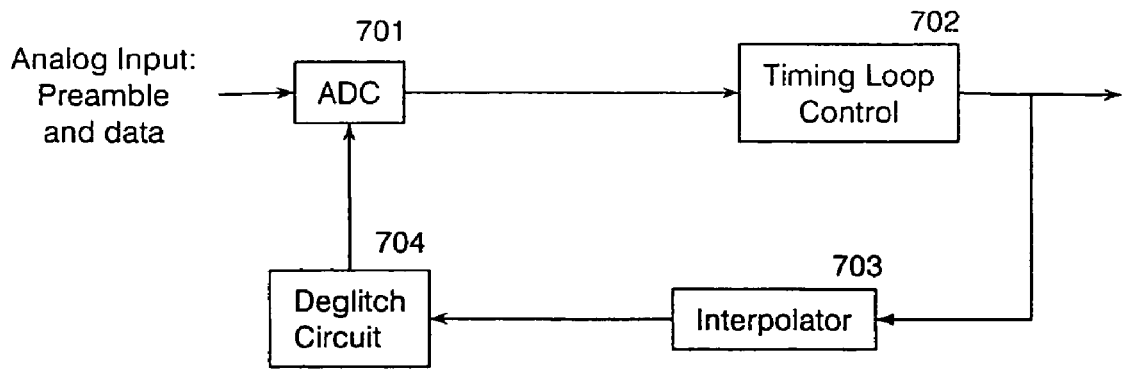
FIG. 7 is a schematic block diagram showing the use of a deglitch circuit in a typical circuit for correcting phase offset of a clock signal.

FIG. 7 shows one implementation of a deglitch circuit 704 to ensure that the clock signal to the analog to digital converter (ADC) 701 is free of glitches. The deglitch circuit 704 may comprise either one or two DCLL circuits. In one case, a single DCLL circuit may be used, provided that the ADC 701 responds sufficiently to a clock signal having a duty cycle which is the resulting duty cycle of the signal from the first DCLL. In one embodiment, the duty cycle is 20-80, though such a result is not a requirement of operation. If a glitch-free clock having a particular duty cycle is required, the deglitch circuit may comprise two DCLL circuits coupled in tandem. The first DCLL circuit removes any glitches, while the second DCLL restores the original duty cycle. In order to restore a duty cycle, for example, a 50-50 duty cycle, the charging current and the discharging current for the capacitor 408 of the second DCLL circuit are equal. To restore a different duty cycle, the charging and discharging currents may differ, as would be known to ordinarily skilled artisans. The DCLL circuit also could provide a different duty cycle from that of the input clock signal, if desired.

Figure 8:
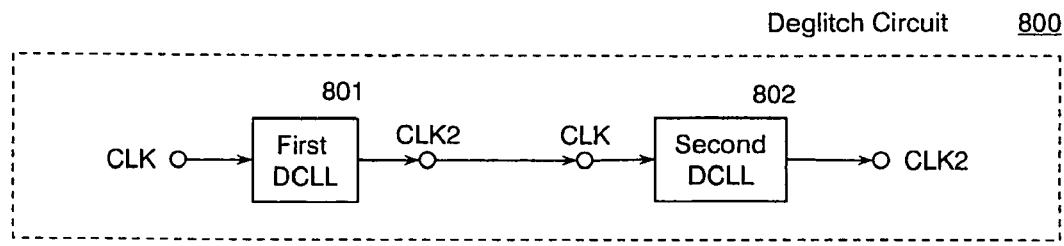
FIG. 8 is a schematic representation of one embodiment of the deglitch circuit showing both a first DCLL circuit and a second, optional DCLL circuit.

FIG. 8 shows a deglitch circuit 800 having a first DCLL circuit 801 and a second, optional DCLL circuit 802 arranged to restore the original duty cycle to a deglitched clock signal.

Figure 9:
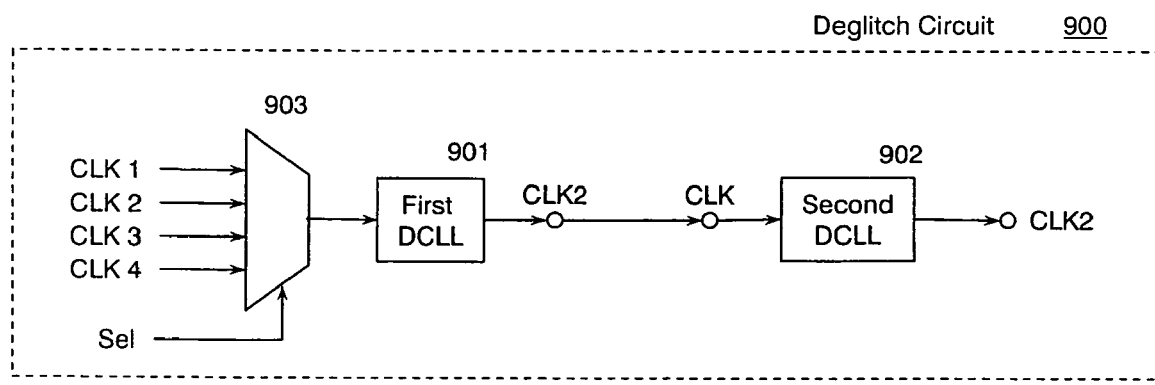
FIG. 9 is another embodiment of the deglitch circuit having a selector for selecting one of a plurality of different input clock signals.

FIG. 9 shows another embodiment of the inventive deglitch circuit further comprising a selector for selecting one of a plurality of input clock signals, each having a different phase offset. A selector signal directs selector 903 to provide one of a plurality of input clocks to a first DCLL circuit 901 to remove glitches present in the selected input clock signal, or resulting from the selection among different input clock signals. A second DCLL circuit 902 may be coupled to the first DCLL 901, to provide an output clock signal having the duty cycle of the input clock signal. The second DCLL circuit is optional, depending on whether the processing circuitry using the output clock signal requires a clock signal having a particular duty cycle (in one embodiment, a 50-50 duty cycle).

Figure 10:
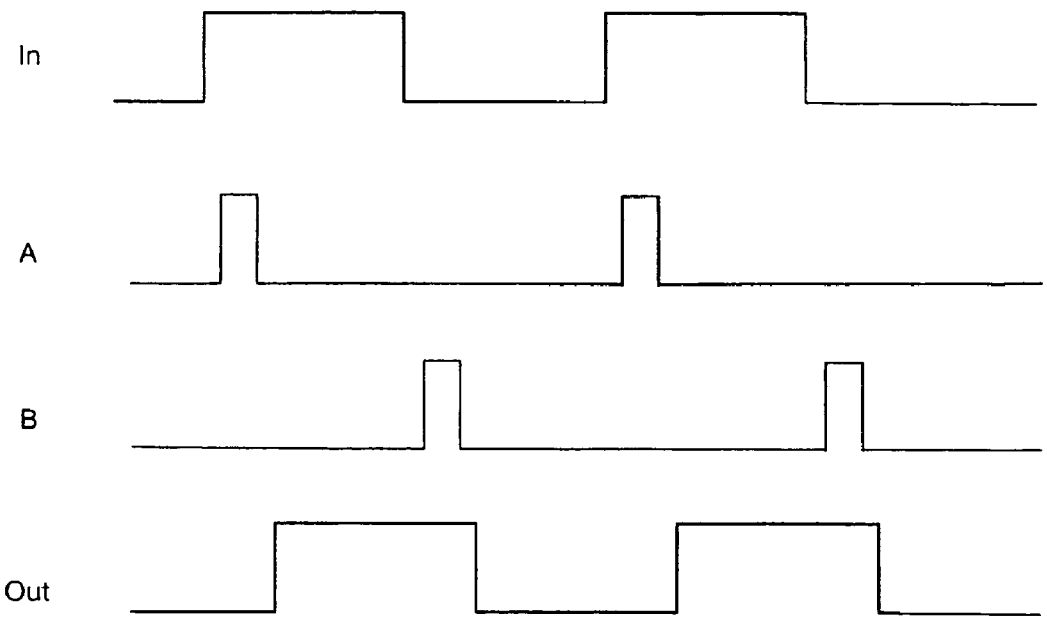
FIG. 10 is a timing diagram showing a relationship among input clock signals and glitches.

FIG. 10 shows a timing diagram for a further embodiment (FIG. 11) in which first and second DCLL circuits 1101, 1103, each acts as a deglitch circuit in a manner similar to the embodiments of FIGS. 8 and 9. DCLL circuit 1101 provides signals to the set input of a flip-flop 1104, and DCLL circuit 1103 provides signals to the reset input of a flip-flop 1104. The signal In in FIG. 10 is an input to DCLL circuit 1101; the same signal In passes through an inverter 1102, the output of which is an input to DCLL circuit 1103. As a result, the input to DCLL circuit 1103 is the inverse of the signal input to DCLL circuit 1101. The input signal In may contain a glitch, such as is shown for example in FIG. 3 or FIG. 6. The output signal A coming from DCLL circuit 1101 is deglitched, as is the output signal B coming from DCLL circuit 1103. The signal Out coming from flip-flop 1104 has the same duty cycle as the input signal In. This way of providing a deglitched signal with the same duty cycle is an alternative to placing two DCLL circuits in series, as in the embodiment of FIG. 8, for example.

The present invention is applicable in a variety of areas, essentially, to any application in which glitches in input clock signals are problematic. One such area is in the field of information storage, including hard disk drive systems (HDD).

In an HDD, data is recorded on magnetic media in tracks, each track having a plurality of sectors. A sector comprises a preamble (for acquiring timing signals), timing bits, a position error field, address bits, data bits, and error correction bits. A read channel uses the preamble to recover the frequency of the recorded data, and creates a clock signal having the same frequency and phase offset as the original data. The present invention, which provides a circuit for a deglitched clock signal synchronized to the data, is applicable to outputting read channels for HDDs. However, as noted, the invention also is applicable wherever a synchronized clock is required to convert or acquire data.

Figure 11:
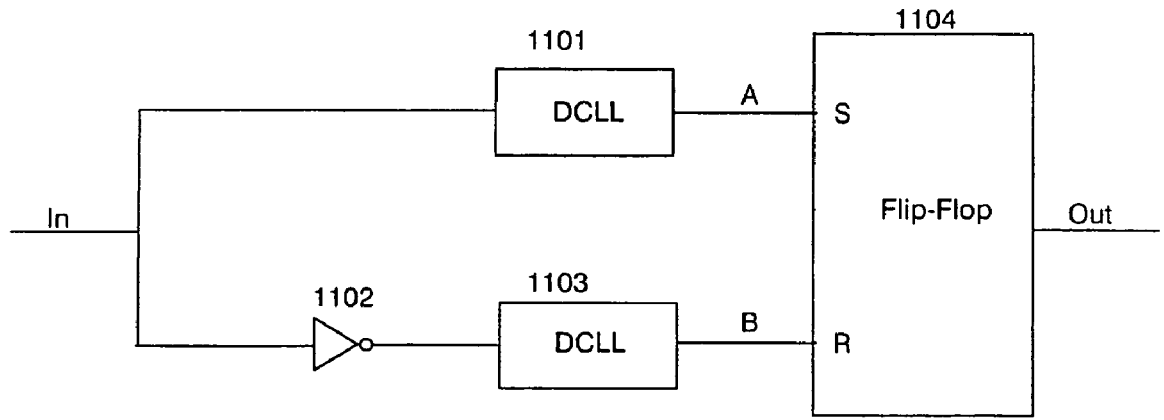
FIG. 11 is a block diagram of another deglitch circuit embodiment.
Figure 12:
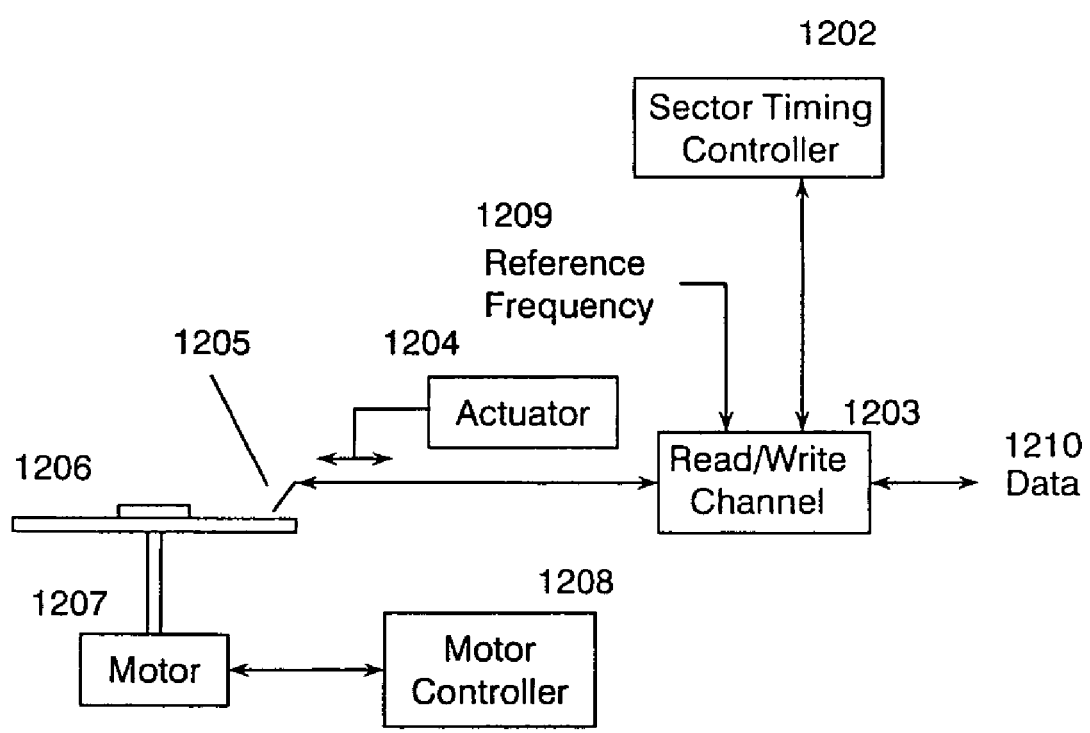
FIG. 12 is a block diagram showing the major components of a typical HDD system.

FIG. 11 shows a schematic representation of a typical HDD, having at least one disk 1106 having a magnetic medium for storing information, a spindle, a motor 1107 and a controller 1108 for controlling disk rotational speed, a transducing head 1105 for reading and writing data, a servo actuator assembly including an actuator 1104 for positioning the head 1105 over the appropriate disk track, and data channels (including read channel 1103) for transmitting data 1110 to and from the disk. The transducing head 1105 reads data from the disk in data blocks over read channel 1103. In switching between reading and writing, for example, glitches can occur in the clock signal. Using the invention in read channel 1103 can remove those glitches.

Therefore, the foregoing is illustrative only of the principles of the invention. Further, those skilled in the art will recognize that numerous modifications and changes are possible. The disclosure of the foregoing embodiments does not limit the invention to the exact construction and operation shown. Accordingly, all suitable modifications and equivalents fall within the scope of the invention.

We claim:

1. A deglitch circuit for removing glitches from an input clock signal, said circuit comprising:
   an input circuit receiving the input clock signal and providing a charging current and a discharging current;
   an inverter providing an output clock signal, wherein the inverter changes state when a voltage related to the discharging current falls below a predetermined threshold, so as to remove glitches from the input clock signal; and
   a further circuit receiving the output clock signal and including a capacitor having a capacitor charging current equal to a capacitor discharging current so that the output clock signal has the same duty cycle as the input clock signal.

2. A deglitch circuit for removing glitches from an input clock signal, said circuit comprising:
   input means receiving the input clock signal and providing a charging current and a discharging current;
   inverter means providing an output clock signal, wherein the inverter means changes state when a voltage related to the discharging current exceeds a predetermined threshold, so as to remove glitches from the input clock signal; and
   further circuit means receiving the output clock signal and restoring a duty cycle of the input clock signal.

3. The deglitch circuit of claim 2, wherein the further circuit means includes capacitor means having a capacitor charging current equal to a capacitor discharging current to provide an output clock signal having the same duty cycle as the input clock signal.

* * * * *